(12) United States Patent
Ikeda

(10) Patent No.: US 6,924,879 B2
(45) Date of Patent: Aug. 2, 2005

(54) SYSTEM, METHOD AND COMPUTER PROGRAM PRODUCT FOR INSTRUCTING ALLOCATION OF A PLURALITY OF EXPOSURE UNITS

(75) Inventor: Makoto Ikeda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 235 days.

(21) Appl. No.: 10/361,583

(22) Filed: Feb. 11, 2003

(65) Prior Publication Data

US 2003/0152851 A1 Aug. 14, 2003

(30) Foreign Application Priority Data

Feb. 14, 2002 (JP) .................................. 2002-037074

(51) Int. Cl.⁷ ............................................. G03B 27/42
(52) U.S. Cl. .............................. 355/53; 430/22; 430/30
(58) Field of Search ....................... 355/53, 77; 430/22, 430/30

(56) References Cited

U.S. PATENT DOCUMENTS 5,243,377 A * 9/1993 Umatate et al. .............. 355/53
5,451,479 A * 9/1995 Ishibashi ..................... 430/22
6,361,907 B1 * 3/2002 Nam et al. ................... 430/30
2002/0111038 A1 * 8/2002 Matsumoto et al. ......... 438/763
2002/0166982 A1 * 11/2002 Kataoka et al. ............... 355/53

FOREIGN PATENT DOCUMENTS

| JP | 11-274074 | 10/1999 |
| JP | 2000-114132 | 4/2000 |
| JP | 2001-28327 | 1/2001 |

* cited by examiner

Primary Examiner—D. Rutledge
(74) Attorney, Agent, or Firm—Oblon, Spivak, McClelland, Maier & Neustadt, P.C.

(57) ABSTRACT

A system for instructing allocation of a plurality of exposure units, having a selector configured to select a first exposure unit to be employed in a process of forming a first exposure pattern on an objective substrate among the exposure units, a mix-and-match unit configured to compute overlay correction values for canceling differences in stage and lens characteristics between the first exposure unit and a second exposure unit that is employed in a process of forming a second exposure pattern on the objective substrate, an allocation commander configured to instruct to allocate the first exposure unit for the objective substrate prior to another substrate scheduled for the first exposure unit, and a storage unit configured to store data concerning the stage and lens characteristics.

20 Claims, 11 Drawing Sheets

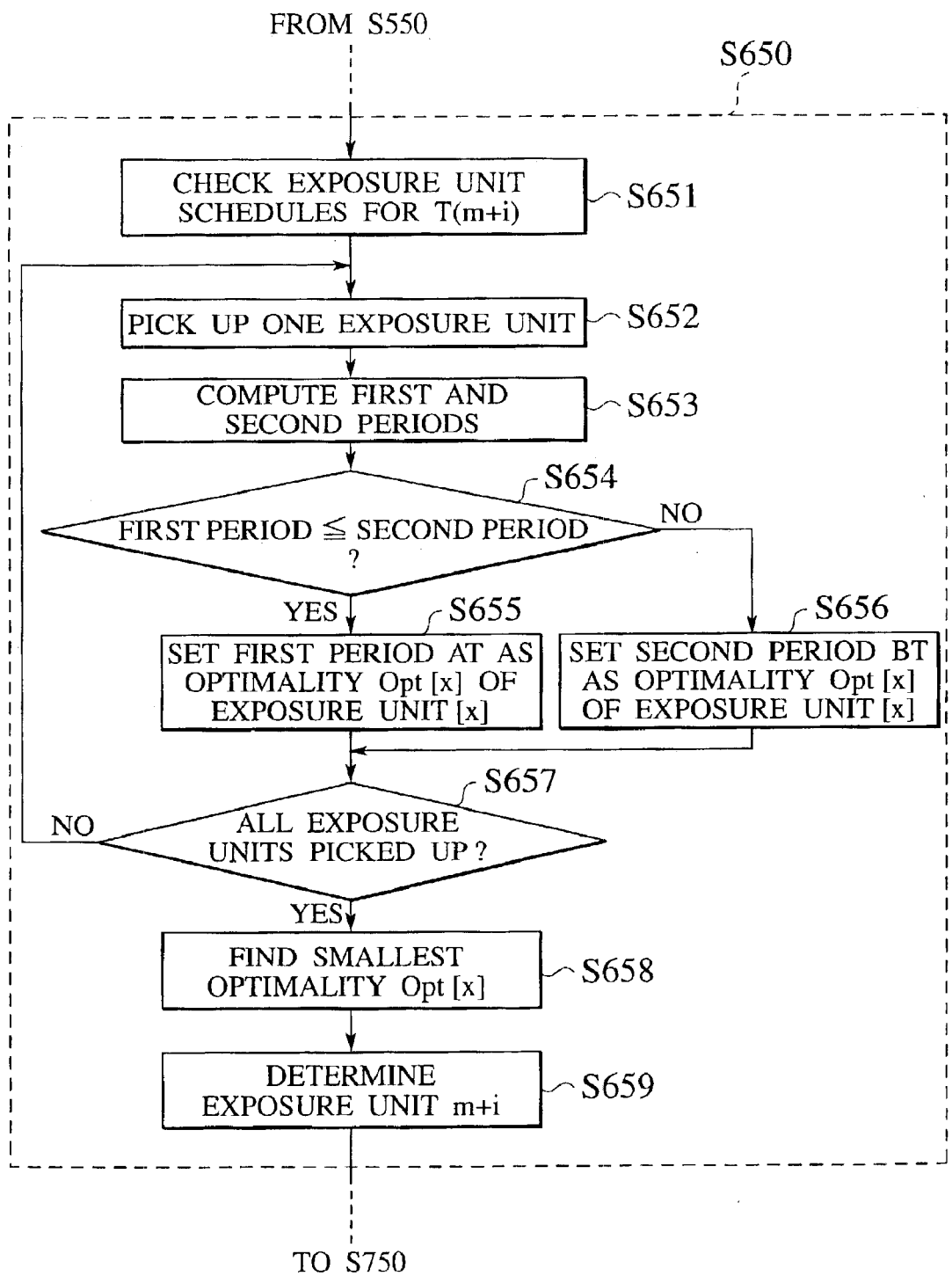

FIG.10A

| EXPOSURE UNIT | STATUS | PROCESS SCHEDULE |
|---|---|---|
| EXPOSURE UNIT 15a | OPERATING | PTa1 PTa2 PTa3 PTa4 |
| EXPOSURE UNIT 15b | OPERATING | PTb1 PTb2 PTb3 PTb4 |
| EXPOSURE UNIT 15c | NONOPERATING | |
| EXPOSURE UNIT 15d | OPERATING | PTd1 PTd2 |
| EXPOSURE UNIT 15e | OPERATING | PTe1 PTe2 PTe3 |

| EXPOSURE UNIT | STATUS | PROCESS SCHEDULE |
|---|---|---|
| EXPOSURE UNIT 15a | OPERATING | |
| EXPOSURE UNIT 15b | OPERATING | PTb4 PTb6 |
| EXPOSURE UNIT 15c | NONOPERATING | PTx |
| EXPOSURE UNIT 15d | OPERATING | |
| EXPOSURE UNIT 15e | OPERATING | |

Tm ← → T(m+1) ← → T(m+2)

SYSTEM, METHOD AND COMPUTER PROGRAM PRODUCT FOR INSTRUCTING ALLOCATION OF A PLURALITY OF EXPOSURE UNITS

CROSS REFERENCE TO RELATED APPLICATIONS

This application is based upon and claims the benefit of priority from the prior Japanese Patent Application No. 2002-37074 filed on Feb. 14, 2002; the entire contents of which are incorporated herein by reference.

BACKGROUND OF THE INVENTION

1. Field of the Invention

The present invention relates to a system, method, and computer program product for instructing allocation of a plurality of exposure units, and particularly, to the use of a mix-and-match technique for properly allocating exposure units according to exposure processes.

2. Description of Related Art

Manufacturing processes to produce electronic devices such as semiconductor devices and liquid crystal devices usually include photolithography processes. Photolithography processes include a thin-film process to form a photo resist film from photosensitive resin, an exposure process to expose the photo resist film, and a development process to develop the exposed photo resist film. The exposure process precisely transfers mask patterns at a given resolution onto a photo resist film formed on a substrate.

Forthepurposeofobtaininghighproductivityandefficiency, an electronic-devices manufacturing factory simultaneously runs many exposure units so as to process a large number of substrates in parallel. In such a case, the same substrate may be repeatedly processed by different exposure units in different exposure processes to form various exposure patterns thereon. The exposure units have individual stage and lens characteristics, and therefore, it is difficult to precisely overlay exposure patterns one upon another at a given resolution on the same substrate. To solve this problem, a related art selectively uses exposure units for different exposure processes depending on the stage and lens characteristics of the exposure units. This technique is called a "mix-and-match" technique. The mix-and-match technique computes an overlay correction value applied to a first exposure unit to be used in a first exposure process according to a second exposure unit used in a second exposure process. The overlay correction value is applied to the first exposure unit, to cancel differences in stage and lens characteristics between the first and second exposure units.

According to the related art, the second exposure process is a past process already completed, and the first exposure process is a current or future process not yet begun. Namely, the related art achieves the mix-and-match technique based on an exposure unit used in a completed past process, in order to select an exposure unit for a current or future process. If the second exposure process is not a past process, i.e., has not yet been carried out, there will be no way for the related art to compute an overlay correction value for the first exposure unit.

BRIEF SUMMARY OF THE INVENTION

A first aspect of the present invention provides a system for instructing allocation of a plurality of exposure units, having a selector configured to select a first exposure unit to be employed in a process of forming a first exposure pattern on an objective substrate among the exposure units, a mix-and-match unit configured to compute overlay correction values for canceling differences in stage and lens characteristics between the first exposure unit and a second exposure unit that is employed in a process of forming a second exposure pattern on the objective substrate, an allocation commander configured to instruct to allocate the first exposure unit for the objective substrate prior to another substrate scheduled for the first exposure unit, and a storage unit configured to store data concerning the stage and lens characteristics.

A second aspect of the present invention provides a method for instructing allocation of a plurality of exposure units, having selecting first and second exposure units to be employed in processes of forming first and second exposure patterns on an objective substrate, respectively, among the exposure units, computing overlay correction values for canceling differences in stage and lens characteristics between the first and second exposure units, and instructing to allocate the first exposure unit for the objective substrate prior to another substrate scheduled for the first exposure unit.

A third aspect of the present invention provides a computer program product for instructing allocation of a plurality of exposure units, having instructions configured to select a first exposure unit to be employed in a process of forming a first exposure pattern on an objective substrate among the exposure units, instructions configured to compute overlay correction values for canceling differences in stage and lens characteristics between the first exposure unit and a second exposure unit that is employed in a process of forming a second exposure pattern on the objective substrate, and instructions configured to instruct to allocate the first exposure unit for the objective substrate prior to another substrate scheduled for the first exposure unit.

BRIEF DESCRIPTION OF THE DRAWINGS

FIG. 9 is a flowchart showing the details of stage S650 of FIG. 8;

FIG. 10A is a table showing the operation schedules of exposure units according to the modification;

FIG. 10B shows that an exposure unit 15b is allocated preferentially for an exposure process m+1 of an objective lot just before a lot for which the exposure unit 15b has been allocated.

DETAILED DESCRIPTION OF THE INVENTION

Figure 1:
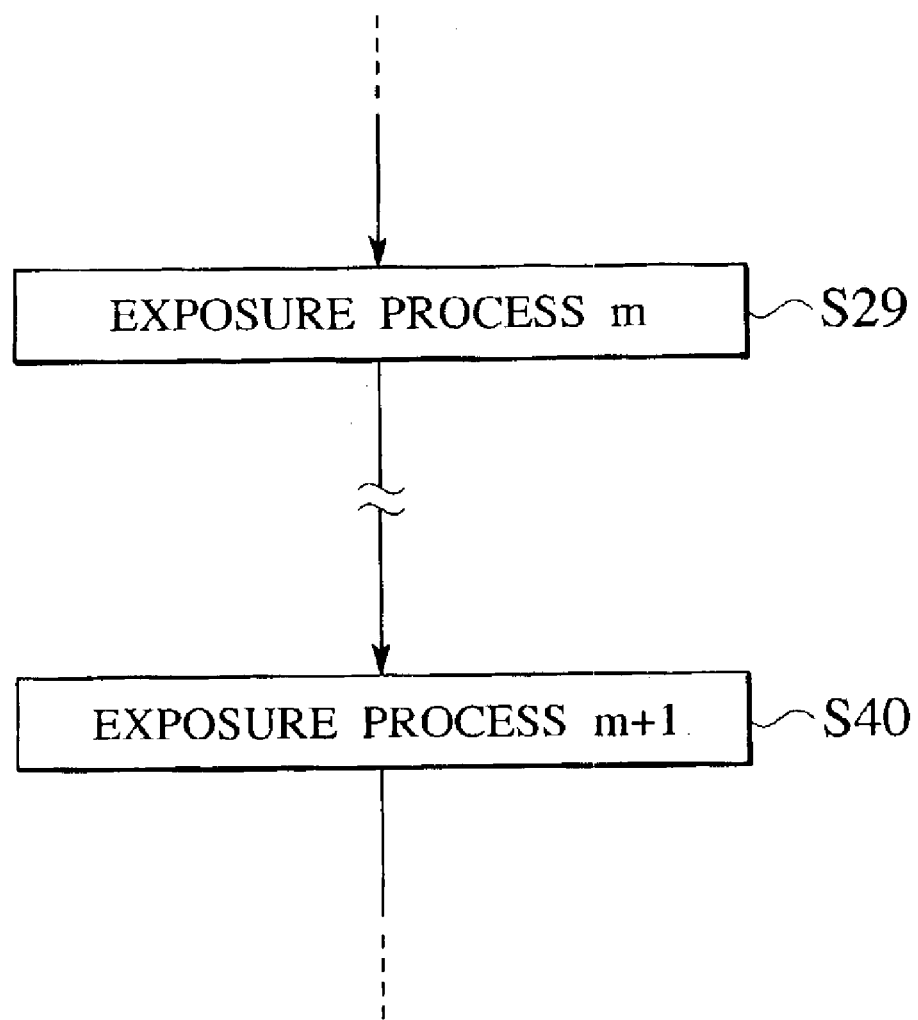
FIG. 1 is a flowchart showing exposure processes m and m+1 according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Mix-and-Match Technique

Electronic devices such as semiconductor devices and liquid crystal devices are usually manufactured by processing substrates lot by lot. The manufacturing processes include a series of mask aligning processes that successively overlay mask patterns one upon another. Substrates are processed lot by lot through different exposure processes that involve different exposure units overlaying exposure patterns one upon another. Such different exposure units have different lens distortions to affect exposed patterns and deteriorate yield. To improve yield in exposing patterns on substrates with different exposure units, it is necessary to employ a mix-and-match technique that considers the lens distortion differences, selects an optimum one from among the exposure units, and computes overlay correction values. Even when carrying out two or more exposure processes with the same exposure unit on a given substrate, it is necessary to compute overlay correction values because the exposure processes involve different processing conditions. Systems for instructing allocation of a plurality of exposure units according to embodiments and modifications of the present invention employ the mix-and-match technique to overlay two or more exposure patterns on a lot of substrates in a series of exposure processes performed by different exposure units.

Allocation Instructing System

A system for instructing allocation of a plurality of exposure units according to an embodiment of the present invention instructs allocation of exposure units for a lot of substrates when processing the lot in different exposure processes. In the following explanation, substrates to be processed are grouped into lots, and each lot is collectively processed by means of exposure processes. The system of instructing allocation of a plurality of exposure units according to the embodiment mentioned below allocates, for a given lot (objective lot) of substrates, two exposure units that carry out individual exposure processes on the objective lot at different time points.

In FIG. 1, stage S29 carries out an exposure process m to form an exposure pattern layer m on each of the substrates. Stage S40 carries out an exposure process m+1 to form an exposure pattern layer m+1 on each of the substrates. The exposure process m in stage S29 is a current process. Exposure processes in stages including stage S40 that follow stage S29 are not started yet. Exposure processes in stages preceding stage S29 are already completed. According to the embodiment, an exposure unit m employed in stage S29 and an exposure unit m+1 employed in stage S40 are allocated for an objective lot of substrates.

In these exposure processes, the exposure unit m, exposure process m, and exposure pattern layer m, serving as a reference exposure unit, reference exposure process, and reference exposure pattern layer, respectively, correspond to a second exposure unit, second exposure process, and second exposure pattern layer, respectively. The exposure unit m+1, exposure process m+1, and exposure pattern layer m+1 correspond to a first exposure unit, first exposure process, and first exposure pattern layer, respectively. Presently, the objective lot is waiting for process conditions for stage S29 to be determined.

Figure 2:
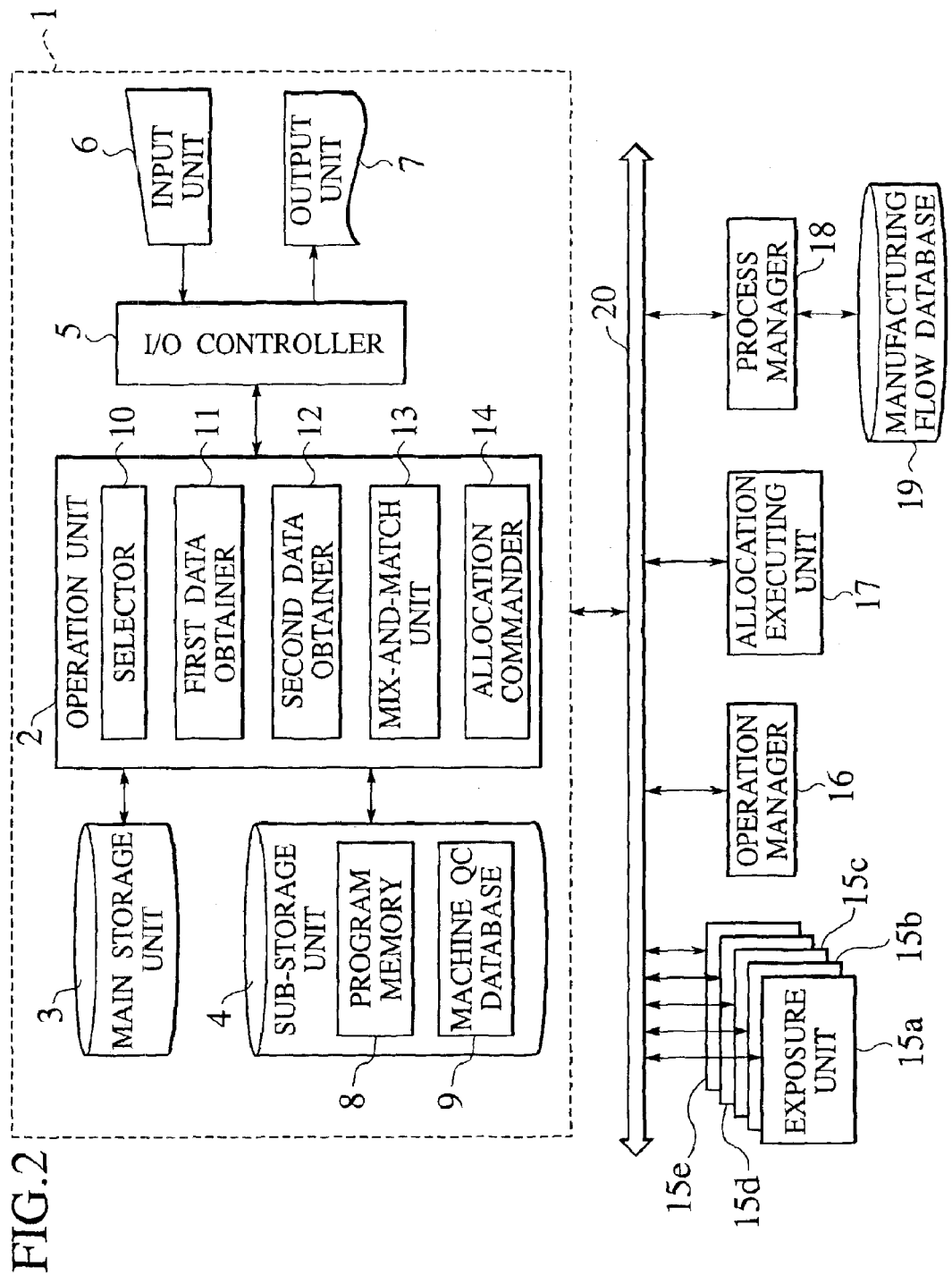
FIG. 2 is a block diagram showing a system for instructing allocation of a plurality of exposure units according to an embodiment of the present invention.

FIG. 2 roughly shows a structure of the system for instructing allocation of a plurality of exposure units 15a, 15b, 15c, . . . according to the embodiment. The system 1 includes an operation unit 2 having an exposure unit allocating function, a main storage unit 3, and a sub-storage unit 4. The storage units 3 and 4 are connected to the operation unit 2. The main storage unit 3 temporarily stores data to be input to the operation unit 2. The sub-storage unit 4 fixedly stores programs and data necessary for operating the system 1. The sub-storage unit 4 includes a program memory 8 to store application software, middle ware, and an operating system (OS). The sub-storage unit 4 also includes a machine QC database 9 to store data on the machine characteristics such as lens and stage characteristics of exposure units.

The operation unit 2 includes a selector 10, a first data obtainer 11, a second data obtainer 12, a mix-and-match unit 13, and an allocation commander 14. The operation unit 2 may be a part of a central processing unit (CPU) of a standard computer system. The selector 10, first data obtainer 11, second data obtainer 12, mix-and-match unit 13, and allocation commander 14 may be exclusive hardware or functional blocks realized by software executed by the CPU. The main storage unit 3 is, for example, a random access memory (RAM) to temporarily store computer-readable programs to execute an method for instructing allocation of a plurality of exposure units according to the embodiment of the present invention and data to be processed by the operation unit 2. The sub-storage unit 4 may be a RAM, a read-only memory (ROM), any other semiconductor memory, an optical disk unit, a magnetic disk unit, or the like. The operation unit 2 is connected to an input unit 6 and an output unit 7 through an I/O controller 5. The input unit 6 receives data and instructions from an operator. The output unit 7 provides overlay correction values. The input unit 6 may include a keyboard, mouse, light pen, flexible disk unit, and the like. The output unit 7 may include a display unit, printer, and the like.

Through a data bus 20, the system 1 is connected to exposure units 15a to 15e (the number thereof is optional), an operation manager 16, an allocation executing unit 17, and a process manager 18. The process manager 18 is connected to a manufacturing flow database 19.

The operation manager 16 manages a list of available exposure units. The allocation executing unit 17 receives a process start request from the process manager 18, determines schedules of the exposure units 15a to 15e and determines exposure units to be employed in respective exposure processes according to the operation statuses and performance of the exposure units 15a to 15e. The schedule of each exposure unit includes an operation status and a process schedule concerning the exposure unit. The process manager 18 manages manufacturing progress and flow.

The selector 10 selects an exposure unit m+1 from among the exposure units 15a to 15e for carrying out the exposure process m+1 on the objective lot. An optimum exposure unit to serve as the exposure unit m+1 will be one causing least influence on lots other than the objective lot when forming the exposure pattern layer m+1 on the objective lot.

The first data obtainer 11 retrieves, from the machine QC database 9, machine QC data concerning the exposure unit m+1 selected by the selector 10. The machine QC data stored in the database 9 includes characteristics such as the lens and stage characteristics of each of the exposure units 15a to 15e. The second data obtainer 12 retrieves, from the machine QC database 9, machine QC data concerning the exposure unit m.

The mix-and-match unit 13 computes overlay correction values for the exposure units m and m+1. The overlay correction values cancel errors between the machine characteristics such as the stage and lens characteristics of the exposure unit m and those of the exposure unit m+1 and are applied to the exposure units m and m+1, respectively.

The allocation commander 14 instructs the allocation executing unit 17 to allocate the exposure unit m+1 for the objective lot prior to the other lots.

Allocation Instructing Method

Figure 3:
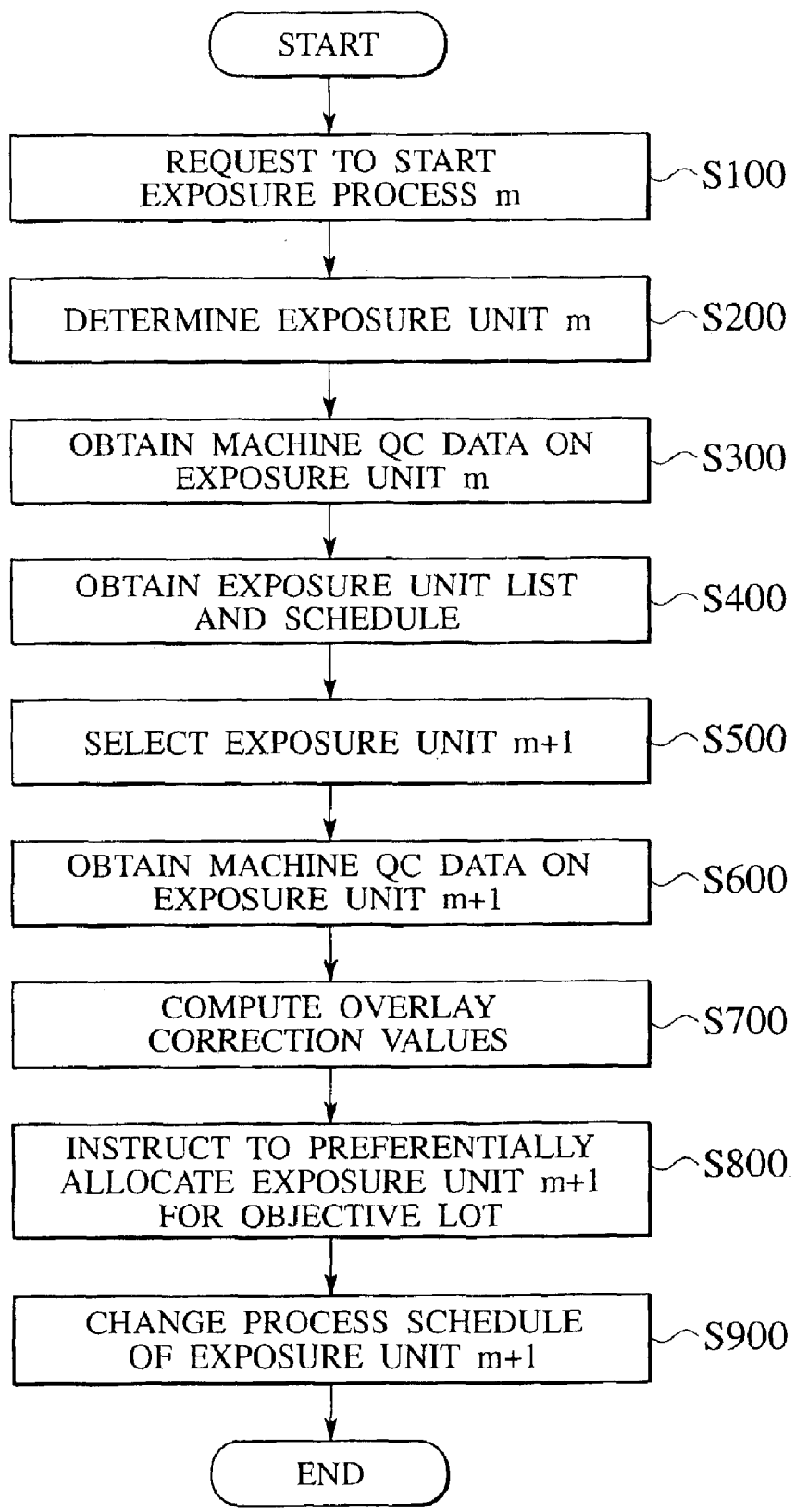
FIG. 3 is a flowchart showing a method of instructing allocation of a plurality of exposure units according to an embodiment of the present invention.

FIG. 3 is a flowchart showing a method for instructing allocation of a plurality of exposure units achieved with the system of FIG. 2.

(1) In stage S100, the process manager 18 of FIG. 2 requests the allocation executing unit 17 to start stage S29 (exposure process m) of FIG. 1 for an objective lot of substrates. In stage S200, the allocation executing unit 17 determines one of the exposure units 15a to 15e as an exposure unit m for the exposure process m.

(2) In stage S300, the second data obtainer 12 retrieves machine QC data concerning the exposure unit m from the machine QC database 9.

(3) In stage S400, the selector 10 obtains, from the operation manager 16, a list of exposure units available for the exposure process m+1, and from the allocation executing unit 17, schedules of the exposure units listed in the list.

(4) In stage S500, the selector 10 selects, as an exposure unit m+1 for the exposure process m+1, one of the exposure units in the list. The exposure unit to be selected as the exposure unit m+1 must be an available exposure unit that least affects, when the exposure unit is allocated for the objective lot at a certain time point, at least one of another lot scheduled for the exposure unit at the same time point or later and the objective lot.

(5) In stage S600, the first data obtainer 11 obtains machine QC data concerning the exposure unit m+1 from the machine QC database 9.

(6) In stage S700, the mix-and-match unit 13 computes overlay correction values according to the machine QC data concerning the exposure units m and m+1. The computed overlay correction values are transferred to the exposure units m and m+1, respectively.

(7) In stage S800, the allocation commander 14 instructs the allocation executing unit 17 to allocate the exposure unit m+1 selected by the selector 10 for the objective lot prior to the other lots.

(8) In stage S900, the allocation executing unit 17 changes a process schedule of the exposure unit m+1 accordingly.

Through stages S100 to S900, the exposure units m and m+1 are determined, and the overlay correction values for the exposure units m and m+1 are computed.

Figure 4:
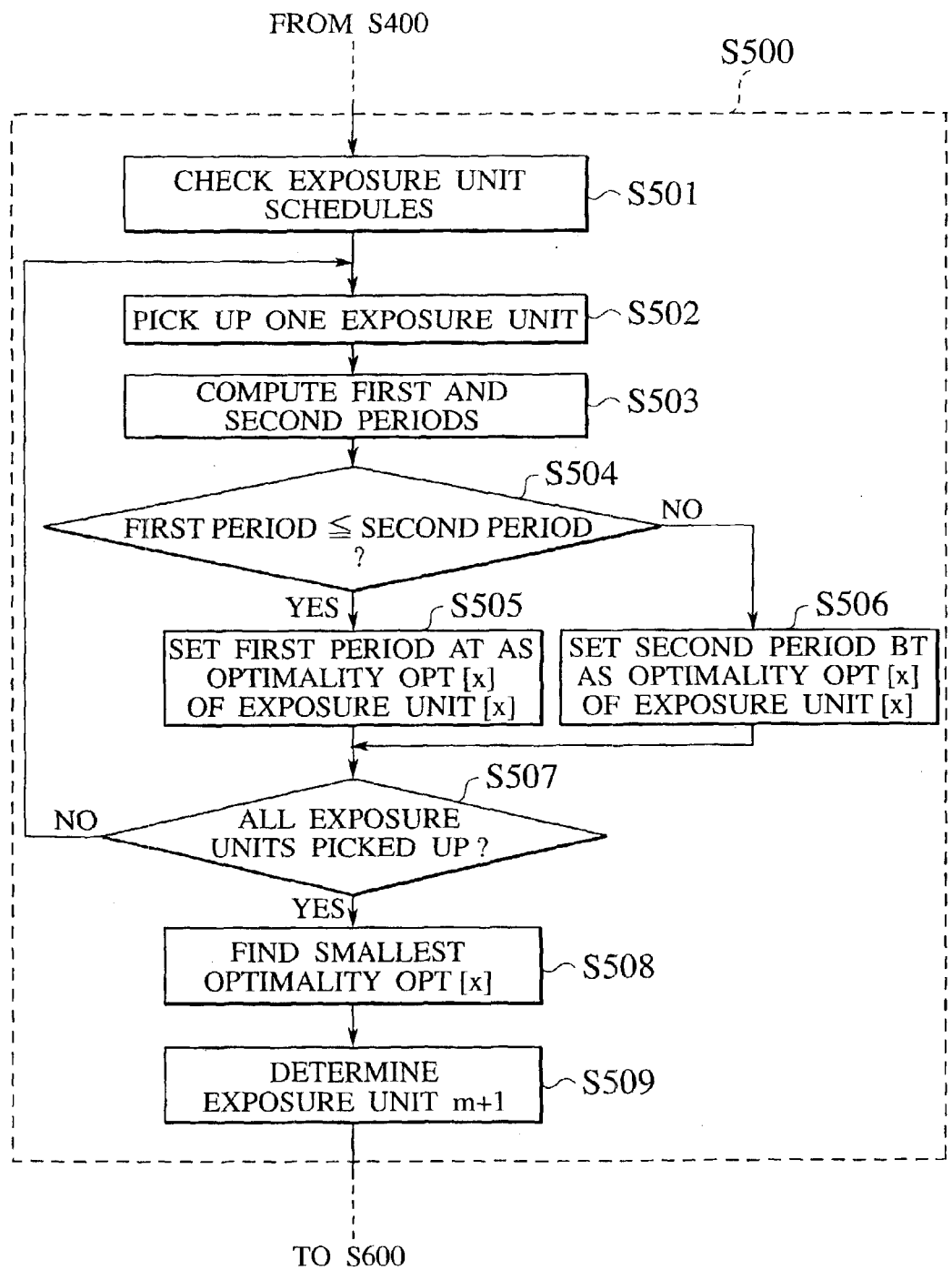
FIG. 4 is a flowchart showing the details of stage S500 of FIG. 3.
Figures 5A, 5B, 5C:
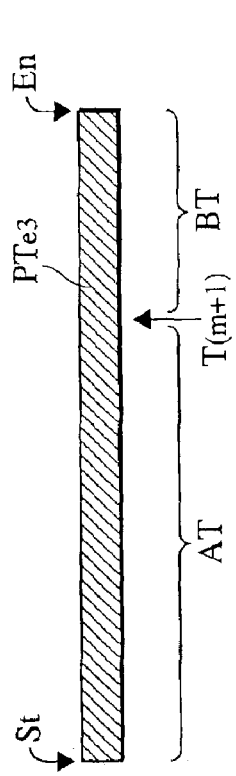
FIG. 5A is a table showing the operation schedules of exposure units according to an embodiment of the present invention.
FIG. 5B explains the first and second periods of a lot to be processed.
FIG. 5C shows that an exposure unit 15b is allocated preferentially for an exposure process m+1 of an objective lot just before a lot for which the exposure unit 15b has been allocated.

Stage S500 of FIG. 3 includes stages S501 to S509 of FIG. 4. The exposure unit list obtained in stage S400 of FIG. 3 includes, in the embodiment, five exposure units 15a to 15e as shown in FIG. 5A. The schedule obtained in stage S400 shows the operation statuses and schedules of the exposure units 15a to 15e as shown in FIG. 5A. In FIG. 5A, an abscissa corresponds to a time axis, and hatched segments represent lot process periods $PTa_1$, $PTa_2$, $PTa_3$, ..., to $PTe_1$, $PTe_2$, $PTe_3$, ... of the exposure units 15a to 15e. The exposure unit 15c is unavailable, and therefore, is allocated for no lots of substrates.

(a) From a process schedule determined by the allocation executing unit 17 for the exposure unit m, time Tm (start time m) is found as shown in FIG. 5A. The time Tm is scheduled to start forming the exposure pattern layer m on the objective lot. Similarly, estimated time T(m+1) (start time m+1) is found to start forming the exposure pattern layer m+1 on the objective lot.

(b) Stage S501 of FIG. 4 examines process schedules of the exposure units 15a, 15b, 15d, and 15e in connection with the start time m+1 T(m+1). More precisely, stage S501 checks to see if the exposure units 15a, 15b, 15d, and 15e are scheduled to process lots at the start time m+1 T(m+1).

(c) Stage S502 picks up one of the exposure units 15a, 15b, 15d, and 15e. In the embodiment, stage S502 picks up the exposure unit 15e.

(d) Stage S503 examines the lot process period $PTe_3$ of the exposure unit 15e, finds process start time St and process end time En thereof as shown in FIG. 5B, and computes a first period AT between the process start time St and the start time m+1 T(m+1) and a second period BT between the start time m+1 T(m+1) and the process end time En. When the exposure unit 15e is scheduled to process no lot at the start time m+1 T(m+1), the first period AT and second period BT are each zero.

(e) Stage S504 compares the first and second periods AT and BT with each other and determines if AT is equal to or shorter than BT. When stage S504 is YES to indicate that the first period AT is equal to or shorter than the second period BT, stage S505 is carried out. When stage S504 is NO to indicate that the first period AT is longer than the second period BT, stage S506 is carried out.

(f) Stage S505 determines the first period AT as an optimality Opt15e of the exposure unit 15e. In FIG. 4, "[x]" represents one of 15a to 15e. The optimality Opt15e indicates the availability of the exposure unit 15e for the exposure process m+1 of the objective lot. When the exposure unit 15e is allocated for the exposure process m+1 of the objective lot, stage S505 will determine that an optimum process period to be allocated for the objective lot is "just before" the lot process period $PTe_3$ because AT is equal to or shorter than BT.

(g) Stage S506 determines the second period BT as an optimality Opt15e of the exposure unit 15e. When the exposure unit 15e is allocated for the exposure process m+1 of the objective lot, stage S506 will determine that an optimum process period to be allocated for the objective lot is "just after" the lot process period $PTe_3$ because AT is longer than BT.

(h) Stage S507 checks to see if each of the available exposure units 15a, 15b, 15d, and 15e has been picked up. In the embodiment of the present invention, stage S502 has picked up only the exposure unit 15e, and the other exposure units 15a, 15b, and 15d have not picked up yet. As a result, stage S507 is NO and stage S502 is repeated. In this way, stages S502 through S506 are repeated on each of the exposure units 15a, 15b, and 15d. When stage S507 is YES to indicate that all of the exposure units 15a, 15b, 15d, and 15e have been examined, stage S508 is carried out.

(i) Stage S508 compares the optimality values Opt[x] of the exposure units [x] with one another, to find a smallest optimality value.

(j) Stage S509 determines the exposure unit [x] having the smallest optimality Opt[x] as the exposure unit m+1 optimum to form the exposure pattern layer m+1 on the objective lot.

The smaller the optimality Opt[x] of the exposure unit [x], the lesser the changes to be made in the lot process periods $PTa_1, \ldots, PTb_1, \ldots, PTd_1, \ldots, PTe_1$, and the like, and therefore, the easier to allocate the exposure unit [x] for the objective lot. Among the exposure units 15a, 15b, 15d, and 15e, the exposure unit [x] having the smallest optimality Opt[x] is selected as the exposure unit m+1. When the exposure unit m+1 is determined, a time point to allocate the exposure unit m+1 for the objective lot is also determined in the process schedule of the exposure unit m+1. After these stages, stage S500 is completed.

In FIG. 5A, the exposure unit 15b has no lot to process at the start time m+1 T(m+1), and therefore, the first and second periods AT and BT of the exposure unit 15b are each zero. Consequently, stage S500 selects the exposure unit 15b as the exposure unit m+1. In stage S900 of FIG. 3, the allocation commander 14 instructs the allocation executing unit 17 to allocate the exposure unit 15b for the objective lot as shown in FIG. 5C. Namely, a lot process period PTx of the objective lot for the exposure process m+1 is preferentially set "just before" the lot process period $PTb_4$ in the schedule of the exposure unit 15b. At this time, the scheduled lot process periods $PTb_4$, $PTb_5$, and the like of the exposure unit 15b are shifted behind the start time m+1 T(m+1) by the lot process period PTx.

Each exposure unit has specific machine characteristics. Even exposure units of the same type or the same series have different characteristics. These different characteristics make it difficult to correctly overlay different exposure patterns on the same substrate. Correcting relative overlay errors from occurring when overlaying different exposure patterns on a substrate will result in correctly forming the patterns on the substrate. The machine characteristics of exposure units include the lens characteristics and stage characteristics thereof. The lens characteristics include image distortion aberrations or lens distortions specific to optical lenses of the exposure units.

According to the above-mentioned embodiment, the system for instructing allocation of a plurality of exposure units determines the exposure unit m+1 and computes overlay correction values applied to the exposure units m and m+1. The exposure process m+1 of the objective lot has not started yet, and therefore, the allocation commander 14 instructs the allocation executing unit 17 beforehand to preferentially allocate the exposure unit m+1 for the exposure process m+1 of the objective lot. In this way, by means of the mix-and-match technique, the system 1 actively reduces exposure pattern overlay errors due to differences in the lens and stage characteristics of exposure units, thus improving processing performance. The allocation commander 14 can prepare efficient process schedules for exposure units to improve the operability of the exposure units.

The method for instructing allocation of a plurality of exposure units mentioned above is expressed in time-series processes, operations, or procedures that are executable in a computer system. Therefore, the method for instructing allocation of a plurality of exposure units can be controlled by a computer program that specifies functions achieved by, for example, a processor in a computer system. The computer program may be stored in a computer program product. The computer program is read from the computer program product by a computer system and is executed thereby, to control the computer system and carry out the method for instructing allocation of a plurality of exposure units. The computer program product may be used as the program memory 8 shown in FIG. 2. Alternatively, the computer program may be read and stored in the program memory 8 to control processes carried out by the operation unit 2. The computer program product may be implemented by a memory unit, a magnetic disk drive, an optical disk drive, or any other device capable of storing the computer program.

Figure 6:
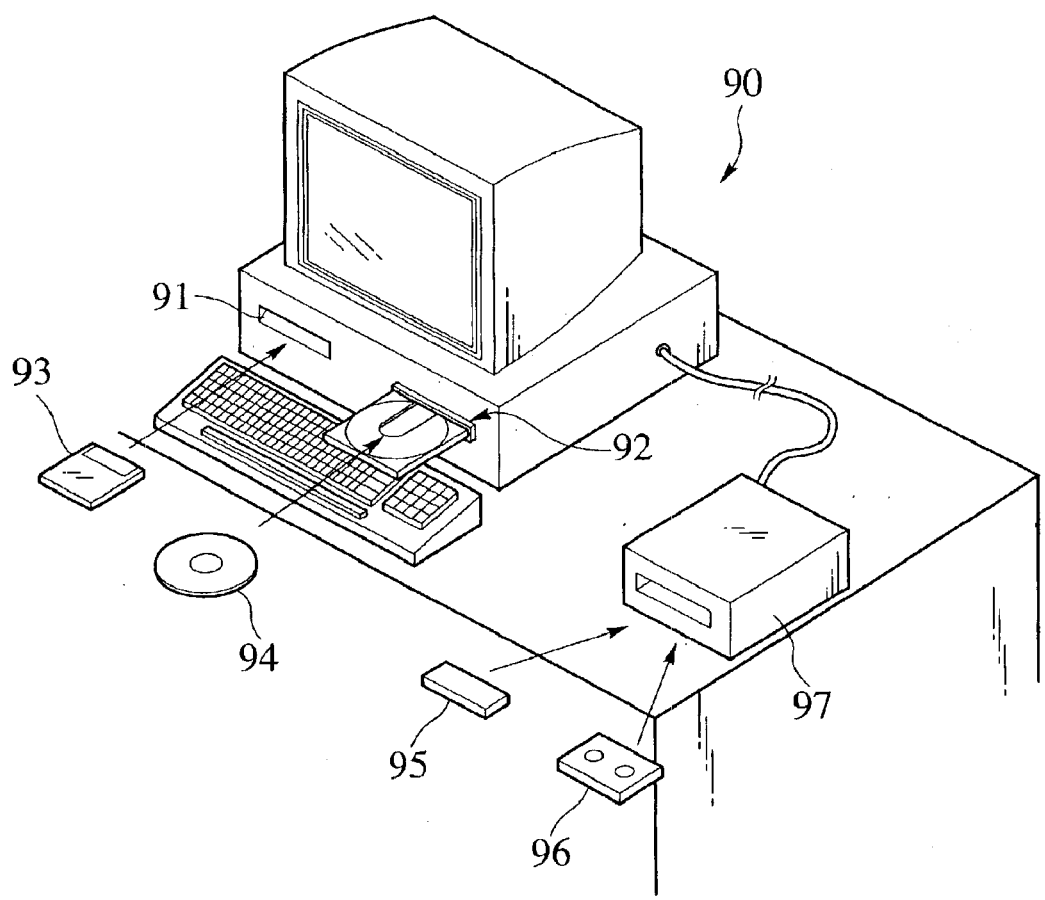
FIG. 6 is a perspective view showing a computer system serving as a system for instructing allocation of a plurality of exposure units according to an embodiment of the present invention.

FIG. 6 shows an example of a computer system 90 serving as the system for instructing allocation of a plurality of exposure units according to the present invention. A front area of the computer system 90 includes a flexible disk drive 91 and a CD-ROM drive 92. The flexible disk drive 91 receives a magnetic flexible disk 93 and reads programs therefrom. The CD-ROM drive 92 receives a CD-ROM 94 and reads programs therefrom. In this way, programs stored in computer program products are installed in the system 90. A drive 97 is connectable to the computer system 90, to handle a ROM 95 that is a semiconductor memory used for, for example, a game pack, or a magnetic cassette tape 96.

Modification

Figure 7:
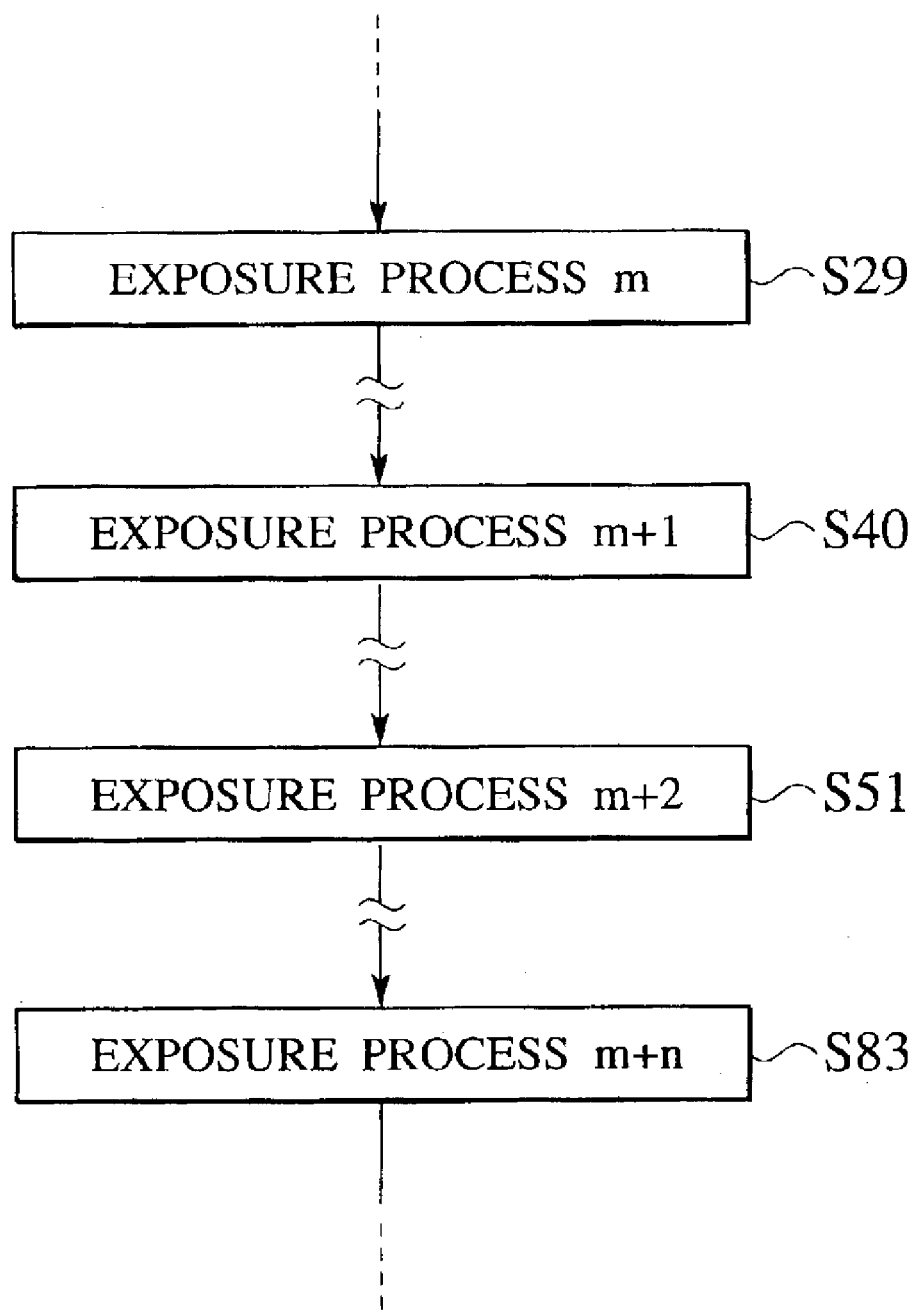
FIG. 7 is a flowchart showing exposure processes m to m+n according to a modification of the embodiment of the present invention.

As shown in FIG. 7, according to a modification of the embodiment, stage S29 carries out an exposure process m to form an exposure pattern layer m on an objective lot of substrates. Based on the exposure process m to form the exposure pattern layer m, stage S40 carries out an exposure process m+1 to form an exposure pattern layer m+1, stage S51 carries out an exposure process m+2 to form an exposure pattern layer m+2, . . . , and stage S83 carries out an exposure process m+n to form an exposure pattern layer m+n on each objective lot. Namely, based on the exposure process m to form the exposure pattern layer m on the objective lot, the n exposure processes are carried out to form the exposure pattern layers m+1 to m+n on the objective lot. The exposure process m in stage S29 is a current process, and the processes that follow are processes not started yet. Processes that precede the exposure process m of stage S29 are already completed. When carrying out the exposure process m in stage S29 on the objective lot, the modification allocates, for the objective lot, an exposure unit m used in stage S29 to carry out the exposure process m, an exposure unit m+1 used in stage S40 to carry out the exposure process m+1, an exposure unit m+2 used in stage S51 to carry out the exposure process m+2, . . . , and an exposure unit m+n used in stage S83 to carry out the exposure process m+n.

Namely, the exposure unit m, exposure process m, and exposure pattern layer m of stage S29 serve as a reference exposure unit, reference exposure process, and reference exposure pattern layer, respectively.

According to modification of the embodiment, the exposure unit m, exposure process m, and exposure pattern layer m correspond to the second exposure unit, second exposure process, and second exposure pattern layer, respectively. The exposure units m+1 through m+n, exposure processes m+1 through m+n, and exposure pattern layers m+1 through m+n correspond to the first exposure units, first exposure processes, and first exposure pattern layers, respectively. At this point, the objective lot is waiting the determination of the process conditions for stage S29.

The system for instructing allocation of a plurality of exposure units according to the modification is basically the same as those shown in FIG. 2. The selector 10 selects optimum exposure units as the exposure units m+1 to m+n from the exposure units 15a to 15e (the number thereof being optional). The optimum exposure units are those having process schedules that will cause least influence, when the exposure units are allocated for the objective lot at certain time points, on other lots scheduled for the exposure units at the same time points. Namely, the optimum exposure units have process schedules that least influence the process schedules of the other lots when starting to form the exposure pattern layers m+1 to m+n on the objective lot.

The first data obtainer 11 retrieves, from the machine QC database 9, machine QC data concerning the exposure units m+1 to m+n selected by the selector 10. The second data obtainer 12 retrieves machine QC data concerning the exposure unit m from the machine QC database 9.

The mix-and-match unit 13 computes overlay correction values for the exposure units m to m+n. The overlay correction values cancel errors between the machine characteristics such as the stage and lens characteristics of the exposure units m+1 to m+n and those of the exposure unit m and are applied to the exposure units m to m+n, respectively.

The allocation commander 14 instructs the allocation executing unit 17 to allocate the exposure units m+1 to m+n for the objective lot prior to the other lots.

By referring to FIG. 8, a method for instructing allocation of a plurality of exposure units according to the modification will be explained.

(1) In stage S150, the process manager 18 requests the allocation executing unit 17 to start stage S29 (exposure process m) of FIG. 7 for an objective lot of substrates. In stage S250, the allocation executing unit 17 determines, as an exposure unit m for the exposure process m of the objective lot, one of the exposure units 15a, 15b, 15c, and the like. The number of the exposure units is optional, and in the modification of the embodiment, there are five exposure units 15a to 15e.

(2) In stage S350, the second data obtainer 12 retrieves machine QC data concerning the exposure unit m from the machine QC database 9.

(3) In stage S450, the selector 10 obtains, from the operation manager 16, a list of exposure units available for the exposure processes m+1 to m+n, and from the allocation executing unit 17, the schedules of the exposure units 15a to 15e listed in the list.

(4) Stage S550 sets i=1 in m+i, to pick up the exposure process m+1. Here, "i" is a natural number chosen from the group of 1 to n.

(5) In stage S650, the selector 10 selects, as an exposure unit m+1 for the exposure process m+1 of the objective lot, one of the exposure units in the list. The exposure unit to be selected as the exposure unit m+1 must be an available exposure unit that least affects, when the exposure unit is allocated for the objective lot at a certain time point, at least one of another lot scheduled for the exposure unit at the same time point or later and the objective lot.

(6) In stage S750, the first data obtainer 11 obtains machine QC data concerning the exposure unit m+1 from the machine QC database 9.

(7) In stage S850, the mix-and-match unit 13 computes overlay correction values according to the machine QC data concerning the exposure units m and m+1. The computed overlay correction values are transferred to the exposure units m and m+1, respectively.

(8) In stage S950, the allocation commander 14 instructs the allocation executing unit 17 to allocate the exposure unit m+1 selected by the selector 10 for the objective lot prior to the other lots.

(9) In stage S1050, the allocation executing unit 17 changes a process schedule of the exposure unit m+1 accordingly. Through stages S150 to S1050, the exposure units m and m+1 are determined, and the overlay correction values for the exposure units m and m+1 are computed.

(10) Stage S1150 checks to see if i=n. Stage S550 has set i=1 at the first cycle, and therefore, stage S1150 is NO to indicate that i is not equal to n. Then, stage S1250 is carried out to set i=2 to pick up the exposure process m+2 and repeat stages S650 to S1050 on the exposure unit m+2. Similarly, the exposure units m+3 to m+n are subjected to stages S650 to S1050. When stage S1150 determines that i=n, the method for instructing allocation of a plurality of exposure units according to the modification is completed. Namely, the exposure units m to m+n are determined for the objective lot and overlay correction values are calculated for the exposure units m to m+n, respectively.

Figure 8:
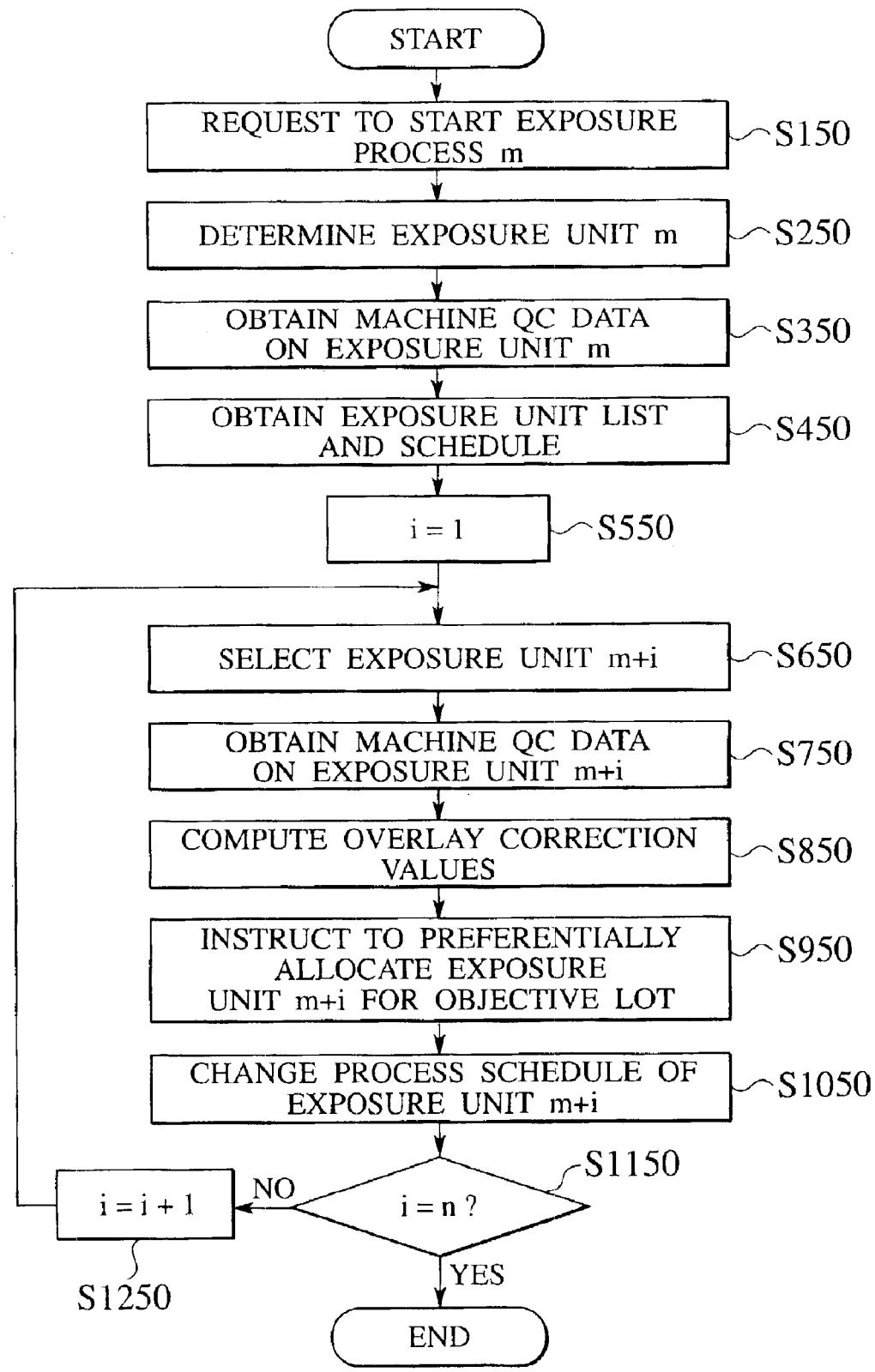
FIG. 8 is a flowchart showing a method of instructing allocation of a plurality of exposure units according to the modification.

Stage S650 of FIG. 8 includes stages S651 to S659 of FIG. 9. The exposure unit list obtained in stage S450 of FIG. 8 includes five exposure units 15a to 15e as shown in FIG. 10A. The schedule obtained in stage S450 shows the operation statuses and schedules of the exposure units 15a to 15e as shown in FIG. 10A. In FIG. 10A, an abscissa corresponds to a time axis and hatched segments represent lot process periods $PTa_1$, $PTa_2$, $PTa_3$, ..., to $PTe_1$, $PTe_2$, $PTe_3$, ... of the exposure units 15a to 15e. The exposure unit 15c is unavailable, and therefore, is allocated for no lots of substrates.

(a) From a process schedule determined by the allocation executing unit 17 for the exposure unit m, a start time Tm shown in FIG. 10A to start forming the exposure pattern layer m on the objective lot is determined. Also found is a start time T(m+1) to start forming the exposure pattern layer m+1 on the objective lot is also found. Stage S651 examines process schedules of the exposure units 15a, 15b, 15d, and 15e in connection with the start time m+1 T(m+1). More precisely, it checks to see if the exposure units 15a, 15b, 15d, and 15e are scheduled to process lots at the start time m+1 T(m+1).

(b) Stage S652 picks up one of the exposure units 15a, 15b, 15d, and 15e. In the modification of the embodiment, it picks up the exposure unit 15e.

(c) Stage S653 examines the lot process period $PTe_3$ of the exposure unit 15e, finds process start time St and process end time En thereof, and computes a first period AT between the process start time St and the start time m+1 T(m+1) and a second period BT between the start time m+1 T(m+1) and the process end time En. When the exposure unit 15e is scheduled to process no lot at the start time m+1 T(m+1), the first period AT and second period BT are each zero.

(d) Stage S654 compares the first and second periods AT and BT with each other and determines if AT is equal to or shorter than BT. When stage S654 is YES to indicate that the first period AT is equal to or shorter than the second period BT, stage S655 is carried out. When stage S654 is NO to indicate that the first period AT is longer than the second period BT, stage S656 is carried out.

(e) Stage S655 determines the first period AT as an optimality Opt15e of the exposure unit 15e. The optimality Opt15e indicates the availability of the exposure unit 15e for the exposure process m+1 of the objective lot. When the exposure unit 15e is allocated for the exposure process m+1 of the objective lot, stage S655 will determine that an optimum process period to be allocated for the objective lot is "just before" the lot process period $PTe_3$ because AT is equal to or shorter than BT.

(f) Stage S656 determines the second period BT as an optimality Opt15e of the exposure unit 15e. When the exposure unit 15e is allocated for the exposure process m+1 of the objective lot, stage S656 will determine that an optimum process period to be allocated for the objective lot is "just after" the lot process period $PTe_3$ because AT is longer than BT.

(g) Stage S657 checks to see if each of the available exposure units 15a, 15b, 15d, and 15e has been picked up. In the first cycle of the modification, stage S652 has picked up only the exposure unit 15e, and the other exposure units 15a, 15b, and 15d have not picked up yet. As a result, stage S657 is NO and stage S652 is repeated. In this way, stages S652 through S656 are repeated on each of the exposure units 15a, 15b, and 15d. When stage S657 is YES to indicate that all of the exposure units 15a, 15b, 15d, and 15e have been examined, stage S658 is carried out.

(h) Stage S658 compares the optimality values Opt[x] of the exposure units [x] with one another, to find a smallest optimality value.

(i) Stage S659 determines the exposure unit [x] having the smallest optimality Opt[x] as the exposure unit m+1 optimum to form the exposure pattern layer m+1 on the objective lot. In the modification of the embodiment, the exposure unit 15b is selected as the exposure unit m+1. When the exposure unit m+1 is determined, a time point to allocate the exposure unit m+1 for the objective lot is also determined in the process schedule of the exposure unit m+1. After these stages, stage S650 is completed for the exposure process m+1.

In FIG. 10A, the exposure unit 15b has no lot to process at the start time m+1 T(m+1), and therefore, the first and second periods AT and BT of the exposure unit 15b are each zero. Consequently, stage S650 of FIG. 8 selects the exposure unit 15b as the exposure unit m+1. In stage S950 of FIG. 8, the allocation commander 14 instructs the allocation executing unit 17 to allocate the exposure unit 15b for the objective lot as shown in FIG. 10B. Namely, a lot process period PTx of the objective lot for the exposure process m+1 is preferentially set "just before" the lot process period $PTb_4$ in the schedule of the exposure unit 15b. At this time, the scheduled lot process periods $PTb_4$, $PTb_5$, and the like of the exposure unit 15b are shifted behind the start time m+1 T(m+1) by the lot process period PTx.

Figure 10C:
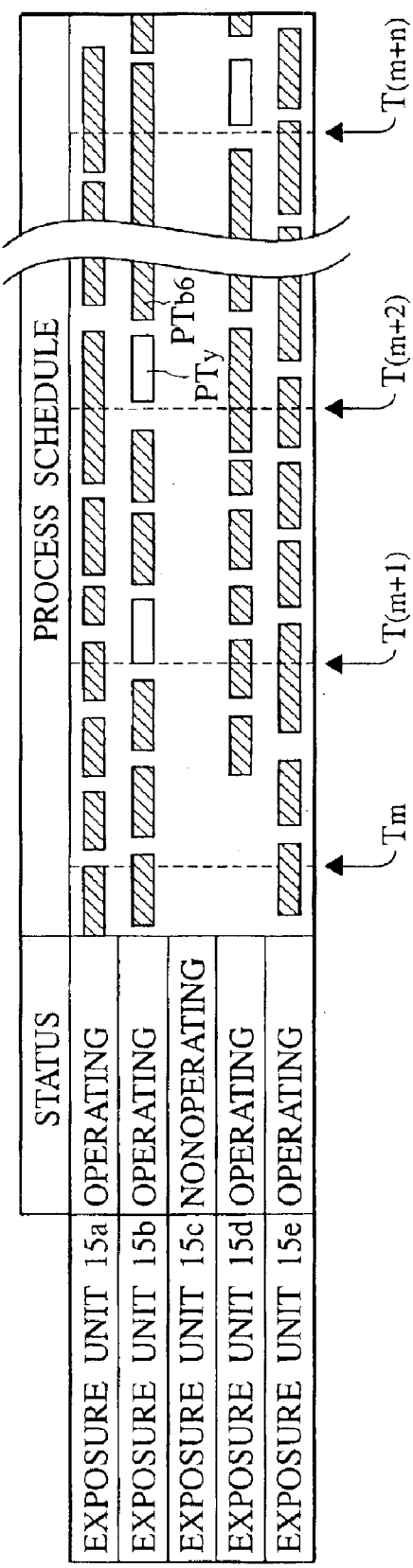
FIG. 10C shows that exposure units 15b and 15d are allocated preferentially for exposure processes m+2 and m+n of the objective lot.

In FIG. 10B, the exposure unit 15b has a smallest optimality Opt15b at start time m+2 T(m+2) to start forming the exposure pattern layer m+2 on the objective lot. As a result, stage S650 of FIG. 8 selects the exposure unit 15b as the exposure unit m+2, and a lot process period PTy of the objective lot for the exposure process m+2 is preferentially set "just before" the lot process period $PTb_6$ in the process schedule of the exposure unit 15b as shown in FIG. 10C. Similarly, exposure units [x] having smallest optimality values Otp[x] at estimated start time T(m+3) to T(m+n) to start forming the exposure pattern layers m+3 to m+n on the objective lot are preferentially allocated for the exposure processes m+3 to m+n of the objective lot.

The system for instructing allocation of a plurality of exposure units according to the modification determines the exposure units m+1 to m+n and computes overlay correction values applied to the exposure units m to m+n. The exposure processes m+1 to m+n on the objective lot have not started yet, and therefore, the allocation commander 14 instructs the allocation executing unit 17 beforehand to preferentially allocate the exposure units m+1 to m+n for the exposure process m+1 to m+n of the objective lot. In this way, by means of the mix-and-match technique, the system 1 actively reduces exposure pattern overlay errors due to differences in the lens and stage characteristics of exposure units, in order to improve the processing performance of the exposure units. The allocation commander 14 can prepare efficient process schedules for the exposure units to improve the operability of the exposure units.

The modification provides the same effectiveness even if there are a plurality of exposure processes that have not yet been started on an objective lot. According to the modification, there is a second exposure process serving as a reference exposure process for the mix-and-match technique and there are a plurality of subsequent exposure processes that refer to the reference exposure process. The modification examines the subsequent exposure processes one by one, determines exposure units available for each of the subsequent exposure processes, respectively, and computes overlay correction values applied to the exposure units. In this way, the modification achieves a complex mix-and-match technique in consideration of the performance of each exposure unit. The modification can minimize overlay errors due to differences in the lens and stage characteristics of exposure units, thus improving processing performance and reducing mistakes by workers resulting from intricate calculations.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A system for instructing allocation of a plurality of exposure units, comprising:
   a selector configured to select a first exposure unit to be employed in a process of forming a first exposure pattern on an objective substrate among the exposure units;
   a mix-and-match unit configured to compute overlay correction values for canceling differences in stage and lens characteristics between the first exposure unit and a second exposure unit that is employed in a process of forming a second exposure pattern on the objective substrate;
   an allocation commander configured to provide instructions to allocate the first exposure unit to the objective substrate prior to an exposure of another substrate scheduled for the first exposure unit; and
   a storage unit configured to store data concerning the stage and lens characteristics.

2. The system of claim 1, wherein the selector selects, as the first exposure unit, an exposure unit having a process schedule that causes a least adverse influence, when the exposure unit is allocated to the objective substrate at a given time point, on at least one of said another substrate scheduled for the exposure unit at the given time point or later and on the objective substrate.

3. The system of claim 1, wherein the process of forming the second exposure pattern is a current process, and the process of forming the first exposure pattern is a process that has not yet been started.

4. The system of claim 1, wherein the overlay correction values include an overlay correction value for the first exposure unit and an overlay correction value for the second exposure unit.

5. The system of claim 1, wherein the second exposure pattern is formed in a single layer, and the first exposure pattern is formed in a single layer.

6. The system of claim 1, wherein the second exposure pattern is formed in a single layer, and the first exposure pattern is formed in a plurality of layers at separate processes.

7. The system of claim 6, wherein for each of the separate processes, the selector selects the first exposure unit, the mix-and-match unit computes the overlay correction values, and the allocation commander provides instructions to allocate the first exposure unit to the objective substrate prior to the exposure of said another substrate.

8. A method for instructing allocation of a plurality of exposure units, comprising:
    selecting first and second exposure units to be employed in processes of forming first and second exposure patterns on an objective substrate, respectively, among the exposure units;
    computing overlay correction values for canceling differences in stage and lens characteristics between the first and second exposure units; and
    instructing the allocation of the first exposure unit to the objective substrate prior to the exposure of another substrate scheduled for the first exposure unit.

9. The method of claim 8, wherein the first exposure unit has a process schedule that causes a least adverse influence, when the first exposure unit is allocated to the objective substrate at a given time point, on at least one of said another substrate scheduled for the first exposure unit at the given time point or later and on the objective substrate.

10. The method of claim 8, wherein the process of forming the second exposure pattern is a current process, and the process of forming the first exposure pattern is a process that has not yet been started.

11. The method of claim 8, wherein the overlay correction values include an overlay correction value for the first exposure unit and an overlay correction value for the second exposure unit.

12. The method of claim 8, wherein the second exposure pattern is formed in a single layer, and the first exposure pattern is formed in a single layer.

13. The method of claim 8, wherein the second exposure pattern is formed in a single layer, and the first exposure pattern is formed in a plurality of layers at separate processes.

14. The method of claim 13, wherein for each of the separate processes, the first exposure unit is selected, the overlay correction values are computed, and the first exposure unit is instructed to be allocated to the objective substrate prior to the exposure of another substrate.

15. A computer program product for instructing allocation of a plurality of exposure units, comprising:
    instructions configured to select a first exposure unit to be employed in a process of forming a first exposure pattern on an objective substrate among the exposure units;
    instructions configured to compute overlay correction values for canceling differences in stage and lens characteristics between the first exposure unit and a second exposure unit that is employed in a process of forming a second exposure pattern on the objective substrate; and
    instructions configured to instruct to allocate the first exposure unit to the objective substrate prior to the exposure of another substrate scheduled for the first exposure unit.

16. The computer program product of claim 15, wherein the first exposure unit has a process schedule that causes a least adverse influence, when the first exposure unit is allocated to the objective substrate at a given time point, on at least one of said another substrate scheduled for the first exposure unit at the given time point or later and on the objective substrate.

17. The computer program product of claim 15, wherein the process of forming the second exposure pattern is a current process, and the process of forming the first exposure pattern is a process that has not yet been started.

18. The computer program product of claim 15, wherein the overlay correction values include an overlay correction value for the first exposure unit and an overlay correction value for the second exposure unit.

19. The computer program product of claim 15, wherein the second exposure pattern is formed in a single layer, and the first exposure pattern is formed in a single layer.

20. The computer program product of claim 15, wherein the second exposure pattern is formed in a single layer, and the first exposure pattern is fanned in a plurality of layers at separate processes.

* * * * *